US012581754B2

(12) United States Patent
Kuo et al.

(10) Patent No.: US 12,581,754 B2
(45) Date of Patent: Mar. 17, 2026

(54) METHOD AND APPARATUS TO ENHANCE SEMICONDUCTOR DEVICE MANUFACTURING

(71) Applicant: TAIWAN SEMICONDUCTOR MANUFACTURING COMPANY, LTD., Hsinchu (TW)

(72) Inventors: Yao-Ren Kuo, Hsinchu (TW); Chih-Wei Wen, Hsinchu (TW); Kun-Lung Hsieh, Hsinchu (TW); Tzu Han Liu, Hsinchu (TW); Hung-Jui Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 379 days.

(21) Appl. No.: 18/198,175

(22) Filed: May 16, 2023

(65) Prior Publication Data

US 2024/0387601 A1      Nov. 21, 2024

(51) Int. Cl.
*H10F 39/00* (2025.01)
*G01N 21/88* (2006.01)
*G03F 7/20* (2006.01)
*H10F 39/15* (2025.01)

(52) U.S. Cl.
CPC ......... *H10F 39/026* (2025.01); *G03F 7/2004* (2013.01); *H10F 39/15* (2025.01); *G01N 2021/8829* (2013.01); *G01N 2021/8832* (2013.01)

(58) Field of Classification Search
None
See application file for complete search history.

(56) References Cited

U.S. PATENT DOCUMENTS

| | | | | | |
|---|---|---|---|---|---|
| 4,585,343 | A | * | 4/1986 | Schave | G01N 21/896 |
| | | | | | 356/613 |
| 5,847,822 | A | * | 12/1998 | Sugiura | G01N 21/88 |
| | | | | | 356/124 |
| 6,459,491 | B1 | * | 10/2002 | Nguyen | G01B 11/0616 |
| | | | | | 356/604 |
| 6,542,238 | B1 | * | 4/2003 | Tsuboi | H05K 13/0812 |
| | | | | | 356/401 |
| 2003/0053046 | A1 | * | 3/2003 | Ise | G01N 21/9501 |
| | | | | | 356/237.4 |

(Continued)

FOREIGN PATENT DOCUMENTS

| | | | | | |
|---|---|---|---|---|---|
| JP | 2020091132 | A | * | 6/2020 | G01N 21/958 |
| KR | 20100078126 | A | * | 7/2010 | G02F 1/1309 |

(Continued)

OTHER PUBLICATIONS

Translation of KR 20100078126 (Year: 2010).*

*Primary Examiner* — Rufus L Phillips
(74) *Attorney, Agent, or Firm* — STUDEBAKER BRACKETT PLLC

(57) ABSTRACT

Pellicles are inspected by projecting a light pattern thereon and monitoring the reflected light by CCD module or the like. Software-based inspection of the reflected pattern recognizes any distortions in the pattern or contamination, and thus identifies wrinkles or other defects in the pellicle prior to use in the manufacturing process. Recognition of defects and replacement will avoid instances of pellicle rupture thereby avoiding damage to wafers being patterned.

20 Claims, 16 Drawing Sheets

(56)  References Cited

U.S. PATENT DOCUMENTS

2015/0293460 A1 \* 10/2015 Takehisa .................. G03F 1/84
                                                               355/67
2021/0116802 A1    4/2021 Lee et al.
2022/0413276 A1 \* 12/2022 Anderson .......... G02B 21/0036

FOREIGN PATENT DOCUMENTS

KR        20140067840 A  \*  6/2014  ........... G06T 1/0007
TW            1722716 B     3/2021

\* cited by examiner

320

410

412

414

430

600

700

```python
# Function to compare the similarity of lengths in two patterns
def compare_lengths(pattern1, pattern2):
    total_difference = 0
    for length1, length2 in zip(pattern1, pattern2):
        difference = abs(length1 - length2)
        total_difference += difference
    return total_difference

# Function to compare the similarity of angles in two patterns
def compare_angles(pattern1, pattern2):
    total_difference = 0
    for angle1, angle2 in zip(pattern1, pattern2):
        difference = abs(angle1 - angle2)
        total_difference += difference
    return total_difference

# Example usage:
pattern1 = [3, 4, 5]
pattern2 = [3.2, 3.8, 4.5]
length_difference = compare_lengths(pattern1, pattern2)
angle_difference = compare_angles(pattern1, pattern2)
print("Length difference:", length_difference)
print("Angle difference:", angle_difference)
```

```
class LineSegment:
  def __init__(self, start, end):
    self.start = start
    self.end = end def length(self):
    x_diff = self.end[0] - self.start[0]
    y_diff = self.end[1] - self.start[1]
    return math.sqrt(x_diff**2 + y_diff**2)

def angle(self, other_line):
    x1, y1 = self.end[0] - self.start[0], self.end[1] - self.start[1]
    x2, y2 = other_line.end[0] - other_line.start[0], other_line.end[1] -
other_line.start[1]
    dot_product = x1*x2 + y1*y2
    mag1 = math.sqrt(x1**2 + y1**2)
    mag2 = math.sqrt(x2**2 + y2**2)
    angle = math.acos(dot_product / (mag1 * mag2))
    return angle
```

FIG. 7B

METHOD AND APPARATUS TO ENHANCE SEMICONDUCTOR DEVICE MANUFACTURING

BACKGROUND

In semiconductor device manufacturing, various types of plasma processes are used to deposit layers of conductive and dielectric material on semiconductor substrates, and also to blanket etch and selectively etch materials from the substrate. One growing technique for semiconductor manufacturing is extreme ultraviolet (EUV) lithography, which employs scanners using light in the EUV spectrum of electromagnetic radiation, including wavelengths from about one nanometer (nm) to about 100 nm. During such processes, the substrate is affixed to a substrate chuck in a process chamber and a plasma is generated adjacent the substrate surface. Various techniques have evolved to affix the substrate to the substrate chuck. For example, an electrostatic chuck (ESC) is used to hold the substrate during the plasma processes, which greatly reduces the probability of forming particles by abrasion and the like.

Pellicles are used in such semiconductor manufacturing processes to reduce pattern defectivity. Pellicles are positioned inside the EUV lithography apparatus on the reticle (or mask) to catch miniscule particles that would otherwise cling to the reticle and be inadvertently printed of the wafer, thereby causing defects on the device being manufactured. Defects in the pellicle itself or its application to the reticle can also cause similar manufacturing defects and thus adversely affect manufacturing yield and costs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 7A depicts exemplary computer code for comparing lengths and angles in a pattern.

FIG. 7B depicts exemplary computer code for measuring lengths and angles in a pattern.

DETAILED DESCRIPTION

Figure 1A:
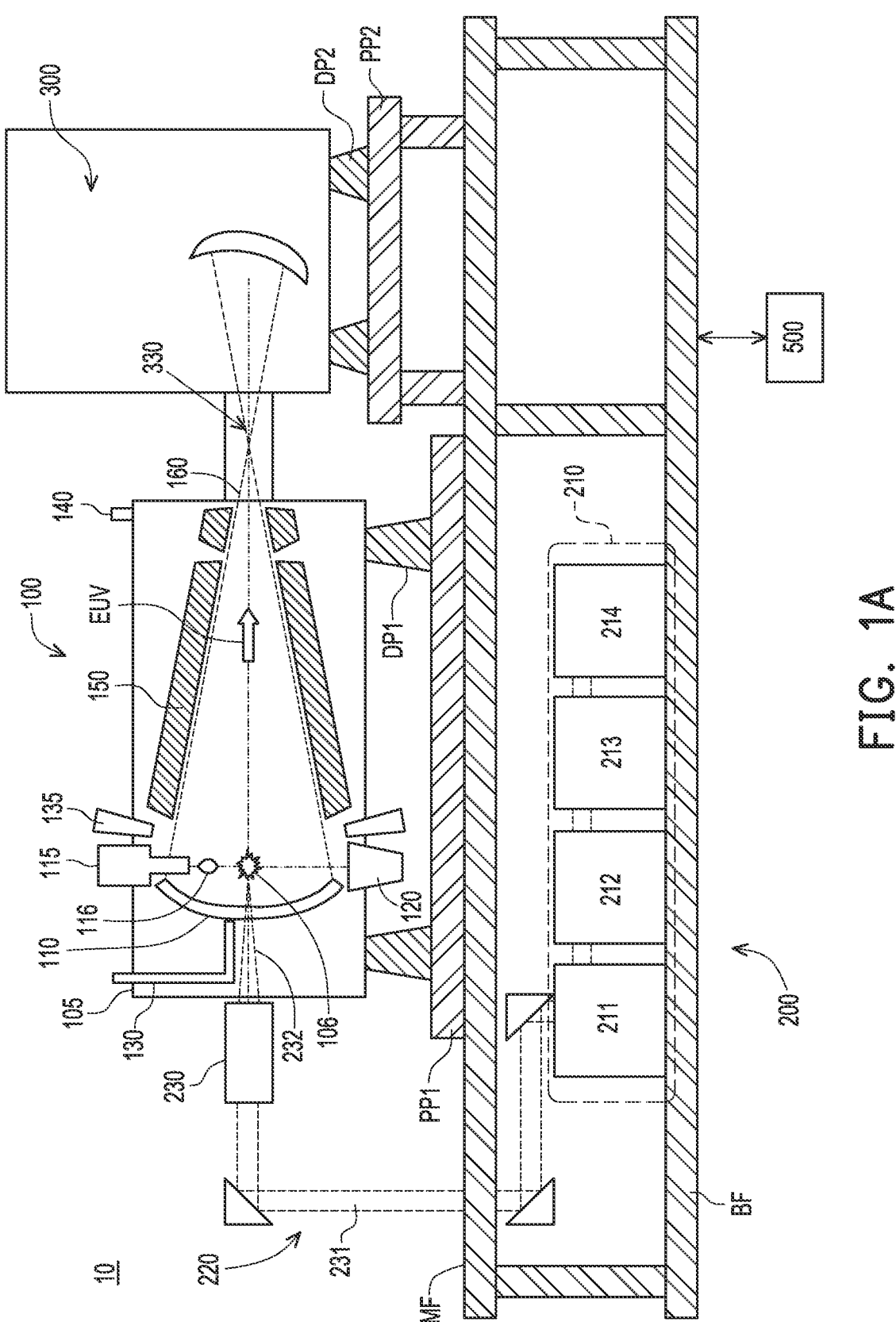
FIG. 1A is a diagram of a lithography apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms "mask," "photomask," and "reticle" are used interchangeably. In the present embodiment, the mask is a reflective mask. One embodiment of the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In various embodiments, the semiconductor substrate is a semiconductor wafer, such as a silicon wafer, or other type of wafer to be patterned. The semiconductor substrate is coated with a resist layer sensitive to the EUV light in the present embodiment. Various components including those described above are integrated together and are operable to perform various lithography exposing processes. The lithography system further includes other modules or is configured to be integrated with (or be coupled with) other modules.

A lithography system is essentially a light projection system. Light is projected through a 'mask' or 'reticle' that constitutes a blueprint of the pattern that will be printed on a workpiece, such as a silicon wafer. The blueprint is four times larger than the intended pattern on the wafer or chip in various embodiments. With the pattern encoded in the light, the system's optics shrink and focus the pattern onto a photosensitive silicon wafer. After the pattern is printed, the system moves the wafer slightly and makes another adjacent or neighboring copy. This process is repeated until the wafer is covered in patterns, completing one layer of the eventual semiconductor device. To make an entire microchip, this process will be repeated one hundred times or more, laying patterns on top of patterns until the entire device is completed. The size of the features to be printed varies depending on the layer, which means that different types of lithography systems are sometimes used for different layers, from the latest-generation EUV systems for the smallest features to older deep ultraviolet (DUV) systems for the largest.

FIG. 1A is a schematic and diagrammatic view of an EUV lithography system 10. The EUV lithography system 10 includes an EUV radiation source apparatus 100 (sometimes referred to herein as a "source side" in reference to it or one or more of its relevant parts) to generate EUV light, an exposure tool 300, such as a scanner, and an excitation laser source apparatus 200. As shown in FIG. 1, in some embodiments, the EUV radiation source apparatus 100 and the exposure tool 300 are installed on a main floor (MF) of a clean room, while the excitation laser source apparatus 200 is installed in a base floor (BF) located under the main floor. Each of the EUV radiation source apparatus 100 and the exposure tool 300 are placed over pedestal plates PP1 and PP2 via dampers DP1 and DP2, respectively. The EUV radiation source apparatus 100 and the exposure tool 300 are coupled to each other at a junction 330 by a coupling mechanism, which may include a focusing unit (not shown).

The EUV lithography system 10 is designed to expose a resist layer to EUV light (or EUV radiation). The resist layer is a material sensitive to the EUV light. The EUV lithography system 10 employs the EUV radiation source apparatus 100 to generate EUV light having a wavelength ranging between about 1 nanometer (nm) and about 100 nm. In one embodiment, the EUV radiation source apparatus 100 generates EUV light with a wavelength centered at about 13.5 nm. In various embodiments, the EUV radiation source apparatus 100 utilizes laser produced plasma (LPP) to generate the EUV radiation.

As shown in FIG. 1A, the EUV radiation source apparatus 100 includes a target droplet generator 115 and an LPP collector 110, enclosed by a chamber 105. The target droplet generator 115 generates a plurality of target droplets 116. In some embodiments, the target droplets 116 are tin (Sn) droplets. In some embodiments, the target droplets 116 have a diameter of about 30 microns ($\mu$m). In some embodiments, the target droplets 116 are generated at a rate of about fifty droplets per second and are introduced into an excitation zone 106 at a speed of about seventy meters per second (m/s or mps). Other material can also be used for the target droplets 116, for example, a liquid material such as a eutectic alloy containing Sn and lithium (Li).

As the target droplets 116 move through the excitation zone 106, pre-pulses (not shown) of the laser light first heat the target droplets 116 and transform them into lower-density target plumes. Then, the main pulse 232 of laser light is directed through windows or lenses (not shown) into the excitation zone 106 to transform the target plumes into an LPP. The windows or lenses are composed of a suitable material substantially transparent to the pre-pulses and the main pulse 232 of the laser. The generation of the pre-pulses and the main pulse 232 is synchronized with the generation of the target droplets 116. In various embodiments, the pre-heat laser pulses have a spot size about 100 $\mu$m or less, and the main laser pulses have a spot size about 200-300 $\mu$m. A delay between the pre-pulse and the main pulse 232 is controlled to allow the target plume to form and to expand to an optimal size and geometry. When the main pulse 232 heats the target plume, a high-temperature LPP is generated. The LPP emits EUV radiation, which is collected by one or more mirrors of the LPP collector 110. More particularly, the LPP collector 110 has a reflection surface that reflects and focuses the EUV radiation for the lithography processes. In some embodiments, a droplet catcher 120 is installed opposite the target droplet generator 115. The droplet catcher 120 is used for catching excess target droplets 116 for example, when one or more target droplets 116 are purposely or otherwise missed by the pre-pulses or main pulse 232.

As shown, the target droplet generator 115 generates tin droplets along a vertical axis. Each droplet is hit by a $CO_2$ laser pre-pulse (PP). The droplet will responsively change its shape into a "pancake" during its travel along the axial direction. After a time duration (PP to MP delay time), the pancake is hit by a $CO_2$ laser main pulse (MP) proximate to a primary focus (PF) in order to generate an EUV light pulse. The EUV light pulse is then collected by an LPP collector 100 and delivered to the exposure tool 300 for use in wafer exposure.

The LPP collector 110 includes a proper coating material and shape to function as a mirror for EUV collection, reflection, and focusing. In some embodiments, the LPP collector 110 is designed to have an ellipsoidal geometry. In some embodiments, the coating material of the collector 100 is similar to the reflective multilayer of an EUV mask. In some examples, the coating material of the LPP collector 110 includes multiple layers, such as a plurality of molybdenum/silicon (Mo/Si) film pairs, and may further include a capping layer (such as ruthenium (Ru)) coated on the multiple layers to substantially reflect the EUV light.

The main pulse 232 is generated by the excitation laser source apparatus 200. In some embodiments, the excitation laser source apparatus 200 includes a pre-heat laser and a main laser. The pre-heat laser generates the pre-pulse that is used to heat or pre-heat the target droplet 116 in order to create a low-density target plume, which is subsequently heated (or reheated) by the main pulse 232, thereby generating increased emission of EUV light.

The excitation laser source apparatus 200 may include a laser generator 210, laser guide optics 220 and a focusing apparatus 230. In some embodiments, the laser generator 210 includes a carbon dioxide ($CO_2$) laser source or a neodymium-doped yttrium aluminum garnet (Nd:YAG) laser source. The laser light 231 generated by the laser generator 210 is guided by the laser guide optics 220 and focused into the main pulse 232 of the excitation laser by the focusing apparatus 230, and then introduced into the EUV radiation source apparatus 100 through one or more apertures, such as the aforementioned windows or lenses.

In such an EUV radiation source apparatus 100, the LPP generated by the main pulse 232 creates physical debris, such as ions, gases and atoms of the droplet 116, along with the desired EUV light. In operation of the lithography system 10, there is an accumulation of such debris on the LPP collector 110, and such physical debris exits the chamber 105 and enters the exposure tool 300 (i.e., the "scanner side") as well as the excitation laser source apparatus 200.

In various embodiments, a buffer gas is supplied from a first buffer gas supply 130 through the aperture in the LPP collector 110 by which the main pulse 232 of laser light is delivered to the tin droplets 116. In some embodiments, the buffer gas is hydrogen ($H_2$), helium (He), argon (Ar), nitrogen ($N_2$), or another inert gas. In certain embodiments, $H_2$ is used, since H radicals generated by ionization of the buffer gas can also be used for cleaning purposes. Furthermore, $H_2$ absorbs the least amount of EUV light produced by the source side, and thus absorbs the least light used by the semiconductor manufacturing operations performed in the scanner side of the lithography apparatus 10. The buffer gas can also be provided through one or more second buffer gas supplies 135 toward the LPP collector 110 and/or around the edges of the LPP collector 110. Further, and as described in more detail later below, the chamber 105 includes one or more gas outlets 140 so that the buffer gas is exhausted outside the chamber 105.

Hydrogen gas has low absorption of the EUV radiation. Hydrogen gas reaching to the coating surface of the LPP collector 110 reacts chemically with a metal of the target droplet 116, thus forming a hydride, e.g., metal hydride. When Sn is used as the target droplet 116, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the Sn debris and $SnH_4$ from entering the exposure tool 300 and the excitation laser source apparatus 200. To trap the Sn, $SnH_4$ or other debris, one or more debris collection mechanisms or devices 150 are employed in the chamber 105. In various embodiments, a computer system 500 controls the EUV lithography system 10 and/or one or more of its components shown in and described above with respect to FIG. 1A.

Figure 1B:
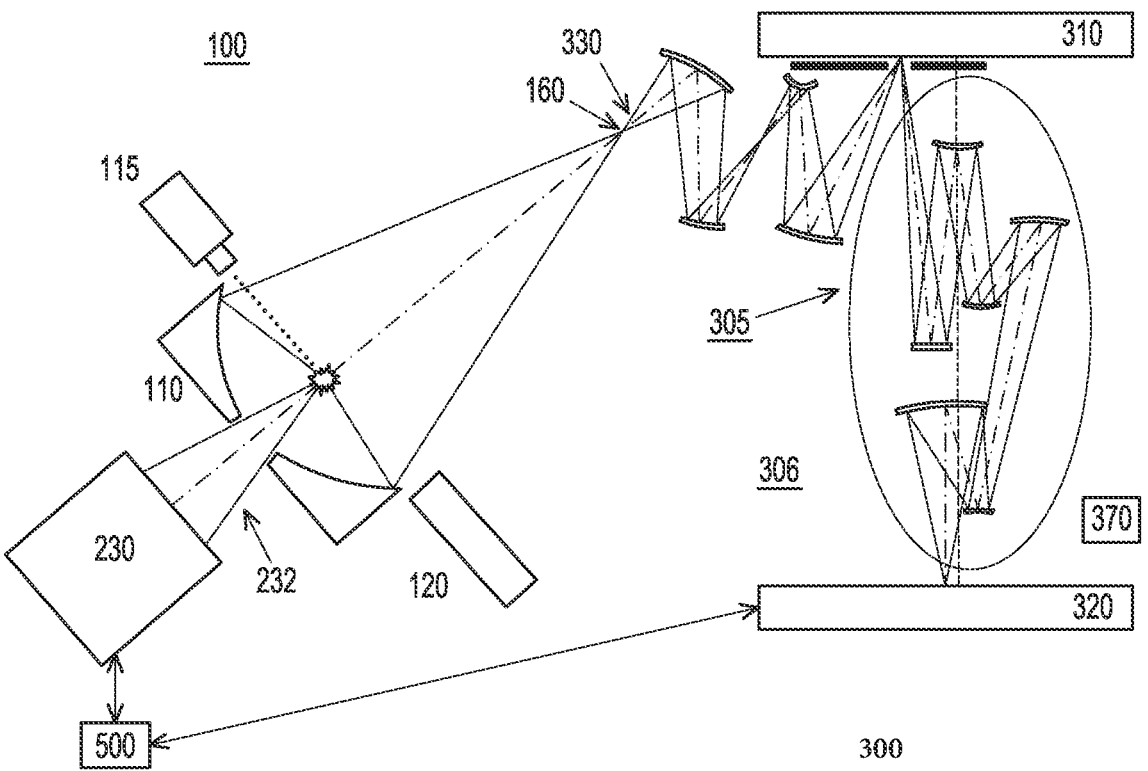
FIG. 1B is a diagram of a source side and a scanner side in accordance with some embodiments.

As shown in FIG. 1B, the exposure tool 300 (sometimes referred to herein as the "scanner side" in reference to it or one or more of its relevant parts) includes various reflective optic components, such as convex/concave/flat mirrors, a mask holding mechanism 310 including a mask stage (i.e., a reticle stage), and wafer holding mechanism 320. The EUV radiation generated by the EUV radiation source apparatus 100, and focused at the intermediate focus 160, is guided by the reflective optical components 305 onto a mask (not shown) secured on the reticle stage 310 (also referenced as a "mask stage" herein) within the processing chamber 306. In various embodiments of the EUV lithography system 10, pressure in the LPP source side is higher than pressure in the scanner side. This is because the source side uses hydrogen gas to force the removal of airborne Sn debris therefrom, while the scanner side is maintained in near vacuum in order to avoid diminishing the strength of the EUV light (being absorbed by air molecules) or otherwise interfering with the semiconductor manufacturing operations performed therein. In various embodiments, the intermediate focus 160 is disposed at the junction 330, namely, the intersection of the source side and the scanner side.

In some embodiments, the distance from the intermediate focus 160 and the reticle disposed in the scanner side is approximately 2 meters. In some embodiments, the reticle size is approximately 152 mm by 152 mm. In some embodiments, the reticle stage 310 includes an electrostatic chuck, or 'e-chuck,' to secure the mask. The EUV light patterned by the mask is used to process a wafer supported on wafer stage 320. Because gas molecules absorb EUV light, the chambers and areas of the lithography system 10 used for EUV lithography patterning are maintained in a vacuum or a low-pressure environment to avoid EUV intensity loss. Nonetheless, a debris collector 370, similar in purpose and design to the debris collector 150, may be provided in the scanner side to dispose of and remove contamination and residue that may accumulate in the components of the scanner side. In various embodiments, the computer system 500 controls one or more of the components of the EUV lithography system 10 as shown in and described with respect to FIG. 1B.

Figure 2A:
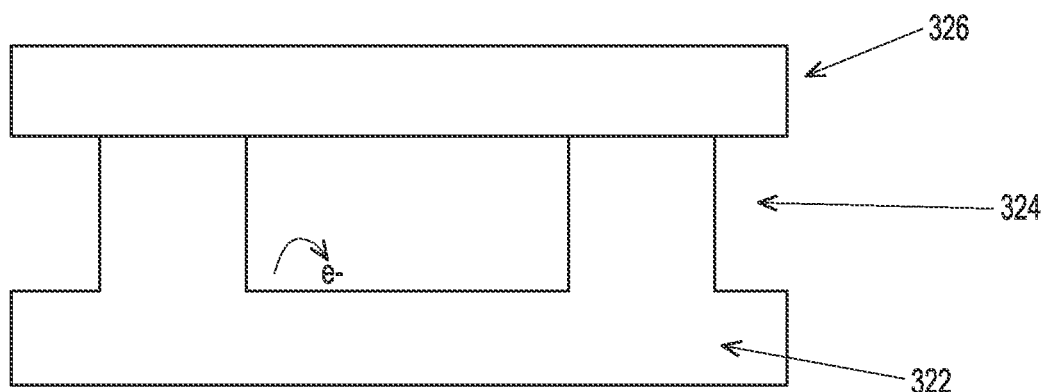
FIG. 2A is a diagram of a wafer stage in accordance with some embodiments.

FIG. 2A is a diagram of a wafer stage 320 placed within the exposure tool 300 of the EUV lithography system 10 in accordance with some embodiments. The wafer stage 320 includes a wafer clamp 322, also referred to herein as a chuck. In various embodiments, the chuck 322 is an electrostatic chuck (ESC) disposed within the process chamber 306, and the ESC is configured to receive a substrate 326. In accordance with various embodiments, the substrate 326 includes a wafer, silicon substrate, or any other useful wafer, workpiece or substrate. In various embodiments, the chuck 322 also includes an internal chuck electrode (not shown), and a source of direct current (DC) power connected to the chuck electrode in order to provide power thereto.

In various embodiments, the substrate 326 is clamped by the chuck 322 by an electrostatic potential. In various embodiments, when a DC voltage from the source of DC power (not shown) is applied to the chuck electrode of the chuck 322 having the substrate 326 disposed thereon, a Coulomb force is generated between the substrate 326 and the chuck electrode. The Coulomb force attracts and holds the substrate 326 on the chuck 322 until the application of the DC voltage from the source of DC power is discontinued. In various embodiments, the applied DC voltage ranges from about 2000 volts to about 3200 volts. In some embodiments, the applied DC voltage is 3000 volts. In some instances, the source of DC power is configured to apply the DC voltage of about 10% to about 90% of the power applied during normal etching operations using direct current. In various embodiments, the source of DC power is configured to apply the DC voltage of about 20% to about 80%, about 30% to about 70%, or about 30% to about 50% of the power applied during normal lithography operations using direct current. In some embodiments, the application of the DC voltage occurs for a duration of about 10 seconds to about 60 seconds, about 10 seconds to about 50 seconds, about 20 seconds to about 40 seconds, or about 20 seconds to about 30 seconds.

In various embodiments, the surface of the electrostatic chuck 322 includes a plurality of burls 324, which have a width in a range from about 100 μm to about 500 μm, a height from the surface of the electrostatic chuck 322 in a range from about 1.0 μm to about 100 μm. In various instances, the burls 324 are spaced from each other in a range from about 1.0 μm to about 5.0 μm. In various embodiments, the electrostatic chuck 322 has greater than two thousand such burls 324, comprising roughly 1.5% of the surface area of the surface of the electrostatic chuck 322, in order to firmly support the substrate 326.

In various embodiments, the application of the DC power positively charges particles or contaminants on the surface of the substrate 326. In various embodiments, the application of the DC power negatively charges particles or contaminants on the surface of the wafer clamp 322, which may settle upon the tops of the burls 324. In some embodiments, debris particles or contaminants are generated from the substrate 326 during lithography operations and/or due to the electrostatic action of the wafer clamp 322. In one or more cases, the debris particles include, but are not limited to, the following elements: Cu, Al, Ni, Ti, O, F, Si, Cu, Al, Ge, Ni, Ti, W, Mo, Fe, Pb, Bi, and In, or alloys or compounds thereof. In some embodiments, the debris particles include molecules such as: $Si_xO_y$, $Al_xO_y$, and $Ti_xO_y$. Over time, surface debris particles and/or contaminants must be removed from the electrostatic chuck 322 in order to prevent damage to the components of the EUV lithography system 10. Various additional operations are herein undertaken to prevent migration of contaminants to the mask and other components.

A pellicle is a thin film or membrane that is mounted on a frame and placed over a wafer or mask during lithography processes. The purpose of the pellicle is to protect such components from dust and other contaminants, which can cause defects in the semiconductor device being manufactured. Pellicles are typically made of materials such as polyamide or silicon nitride, which acts as a barrier from the lithography processing environment. It is placed on top of the substrate and the mask is placed on top of it. When the substrate is exposed to the light, the mask pattern is transferred to the photoresist through the pellicle. This way, it protects the photoresist from environmental factors such as dust, debris, and humidity while the pattern is being transferred to the substrate.

Figure 2B:
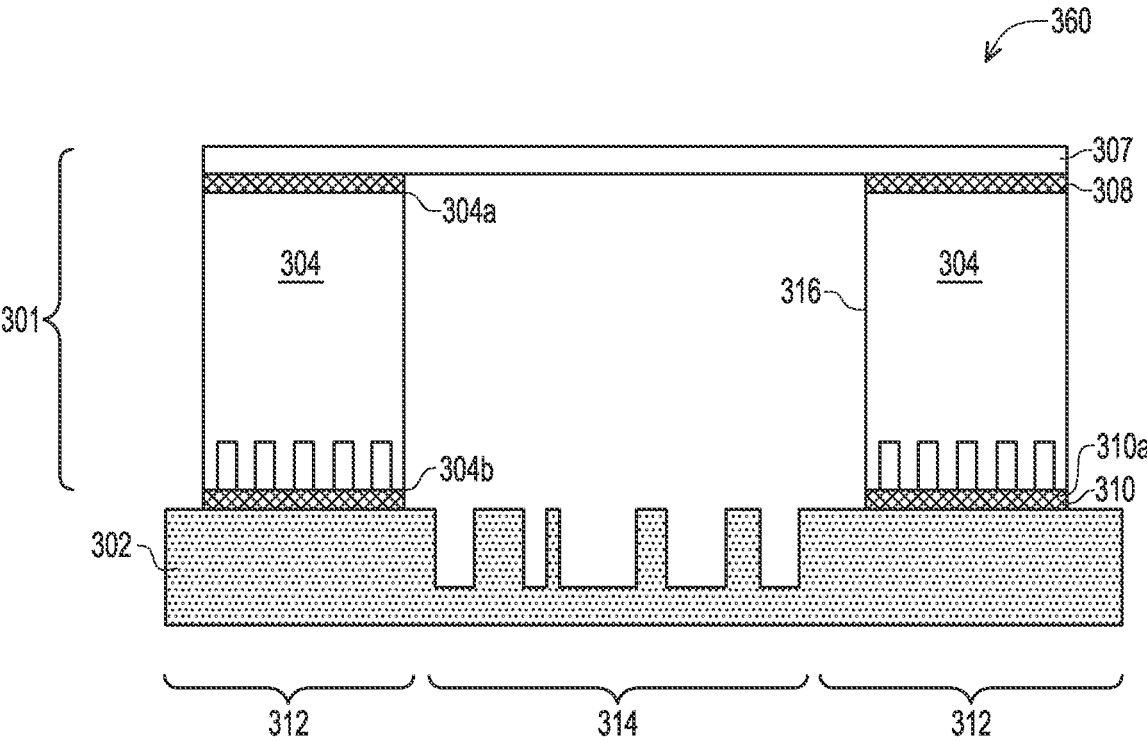
FIG. 2B is a diagram of a pellicle-mask structure in accordance with some embodiments.

FIG. 2B is a diagram of a mask-pellicle system 360 including a pellicle 301 and a mask 302 in accordance with various embodiments. In some instances, the pellicle 301 includes a pellicle frame 304 and a membrane 307 (or pellicle membrane) integrated together by an adhesive material layer 308. In various cases, the pellicle 301 and the mask 302 are integrated together through adhesive material layer 310. In various instances, the mask 302 also includes a boundary region 312 for attaching the pellicle 301, and a circuit region 314 used to define a circuit pattern to be transferred to a semiconductor substrate 326 by a lithographic process. In some embodiments, the mask 302 is integrated in the mask-pellicle system 360 and is secured collectively with the membrane 307 and the pellicle frame 304 of the pellicle 301 during a lithography patterning process.

As illustrated in FIG. 2B, the membrane 307 is configured proximate to the mask 302 and is attached to a first surface 304a of the pellicle frame 304 through the adhesive material layer 308 in various embodiments. In some instances, the membrane 307 is attached to the pellicle frame 304 through the adhesive material layer 308. In some embodiments, the mask 302 is further attached to a second surface 304b of the pellicle frame 304 through the adhesive material layer 310. In various instances, the pellicle 301 is attached to the boundary region 312. Thus, the mask 302, the pellicle frame 304, and the membrane 307 are configured and integrated to enclose an internal space in various examples. In various embodiments, the circuit region 314 of the mask 302 is enclosed in the internal space and is therefore protected from contamination during a lithography patterning process, as well as during mask handling and shipping.

In various embodiments, the membrane 307 is made of a thin film transparent to at least 13 nm radiation and other wavelengths in the extreme ultraviolet band used in EUV lithography patterning processes and furthermore, is reflective of other bands of radiation such as infrared, visible and ultraviolet bands in the wavelengths between about 200 nm and about 1500 nm. In some embodiments, the membrane 307 has a thermal conductive surface. In some instances, the membrane 307 is also configured proximate to a circuit region 314 on the mask 302. In various embodiments, the membrane 307 includes a transparent material layer with a thermal conductive film on one or both surfaces. In one or more embodiments, the membrane 307 is composed at least in part of silicon. In various cases, the length and width of the membrane is between 200 millimeters (mm) and 450 mm, and its thickness is in the range of 25 to 50 micrometers (μm).

In additional embodiments, the mask-pellicle system 360 includes the pellicle frame 304 configured such that the membrane 307 can be attached and secured to the pellicle frame 304. The pellicle frame 304 is designed in various dimensions, shapes, and configurations. In alternate embodiments, the pellicle frame 304 has one single component or multiple components. In various embodiments, the pellicle frame 304 includes a material with sufficient mechanical strength, and designed in dimension, shape, and configuration to secure the membrane 307 properly across the pellicle frame 304. The pellicle frame 304 has a second surface 304b disposed over the adhesive material layer 310 in various embodiments.

In various embodiments, the pellicle frame 304 includes a metal, metal-alloy, or ceramic material, including, without limitation: Ti, $Ti_6Al_4V$, TiSi, Fe—Ni (INVAR), Fe—Ni—Co (Covar), or a combination thereof. In some embodiments, the metal or metal-alloy material is doped with Cu, W, Mo, Cr, or a combination thereof. In one or more embodiments, the pellicle frame 304 is constructed of a material that provides chosen characteristics, including: high mechanical strength, light weight, porosity, and/or thermal conductivity. In one or more embodiments, the pellicle frame 304 is formed by injection molding, compression molding, lathe, milling machine, laser dicing, sintering, or a combination thereof. In one or more embodiments, the pellicle frame 304 includes a low thermal expansion material (LTEM). In one or more embodiments, the pellicle frame 304 is constructed of a material having a thermal expansion coefficient similar to that of the substrate 302 and the membrane 307. Since the mask-pellicle system 360 is used in the lithography process at temperatures ranging from about room temperature to about 150° C., providing the substrate 302, the pellicle frame 304, and the membrane 307 having similar thermal expansion coefficients helps mitigate issues resulting from differential expansion of materials with changes in temperature. In one or more embodiments, the thermal expansion coefficient of the pellicle frame 304 is comparable to that of silicon.

In various embodiments, the adhesive material layer 310 includes an adhesive 310*a* (or glue), including without limitation silicon, acrylic, epoxy, thermoplastic elastomer rubber, one or more acrylic polymers or copolymers, or a combination thereof. In some examples, the adhesive 310*a* includes methyl methacrylate. In various embodiments, the adhesive 310*a* includes a gel-like material. In various embodiments, the adhesive 310*a* is a crystal and/or amorphous structure. In one or more embodiments, the maximum operating temperature of the adhesive 310*a* is a maximum temperature reached during the lithography process. In some embodiments, the maximum operating temperature ranges from about room temperature to about 100° C. In one or more embodiments, the adhesive 310*a* may include a thermal conductive component to enhance thermal conduction within the adhesive material layer 310 and between the mask 302 and the pellicle frame 304. Enhanced thermal conduction results in more uniform heating and less temperature gradient that improves transition of the adhesive 310*a* from a glassy state to a rubbery state. In various embodiments, the adhesive 310*a* exhibits other desirable characteristics, such as high mechanical strength, few to no defects, little to no outgassing, EUV compatibility (no significant degradation upon EUV radiation), sustainability to high service temperature, or a combination thereof.

In various embodiments, the second surface 304*b* undergoes a surface treatment of oxidation or nitridation. In some embodiments, the oxidation or nitridation is performed by a physical vapor deposition (PVD) process or furnace process. In other embodiments, a surface coating (not shown) is applied to the second surface 304*b*. In some embodiments, the surface coating is applied by PVD or electroplating, which includes applying a metal or metal-alloy including W, Mo, Ni, Fe, Cr, Ti, Al, or a combination thereof. The surface treatment and/or surface coating enhances an adhesion strength between the second surface 304*b* and the adhesive 310*a* in various instances. In various embodiments, the pattern 331 is formed using a lithographic patterning process applied to the second surface 304*b*.

Before mounting to the mask 302, the pellicle membrane 307 is visually inspected for uniformity and defect-free appearance. After the membrane 307 is mounted, in some instances, to the pellicle frame 304, the membrane 307 is again visually inspected in the same manner. Uneven application of the membrane 307 to the frame 304, or mishandling of the pellicle 301 after mounting, can wrinkle or tear the membrane 307. If a wrinkle, tear, contamination, or other defect is identified on the pellicle 301 during either inspection above, the production flow is halted and the pellicle 301 is replaced, in order to avoid such defect being optically transferred to the wafer during lithography operations and exposing the mask 302 to contamination. If instead, the membrane 307 appears defect-free, it is sent for air blade treatment before being placed within the exposure tool 300 in preparation for lithography operations. Direct visual inspection performed by a human inspector could inadvertently overlook minor defects and fail to prevent lithography process errors in some instances. Accordingly, an automated inspection process is introduced to avoid disruptions caused by various pellicle defects, including wrinkles, tears, contamination, and rupture.

One property of various Si membranes of EUV pellicles is that they reflect light in various wavelengths other than the EUV range like a mirror. To increase the accuracy of defect identification, it has been discovered that this reflective property of the membrane 307, in the 200 nm to 1500 nm wavelengths, is useful for enabling automated detailed inspection of the EUV pellicle 30 itself. In particular, in various embodiments, a pattern is projected on to a surface of the membrane 307 of the pellicle 301 and a reflection of the pattern is analyzed for any distortions caused by defects in the membrane 307.

Figure 3A:
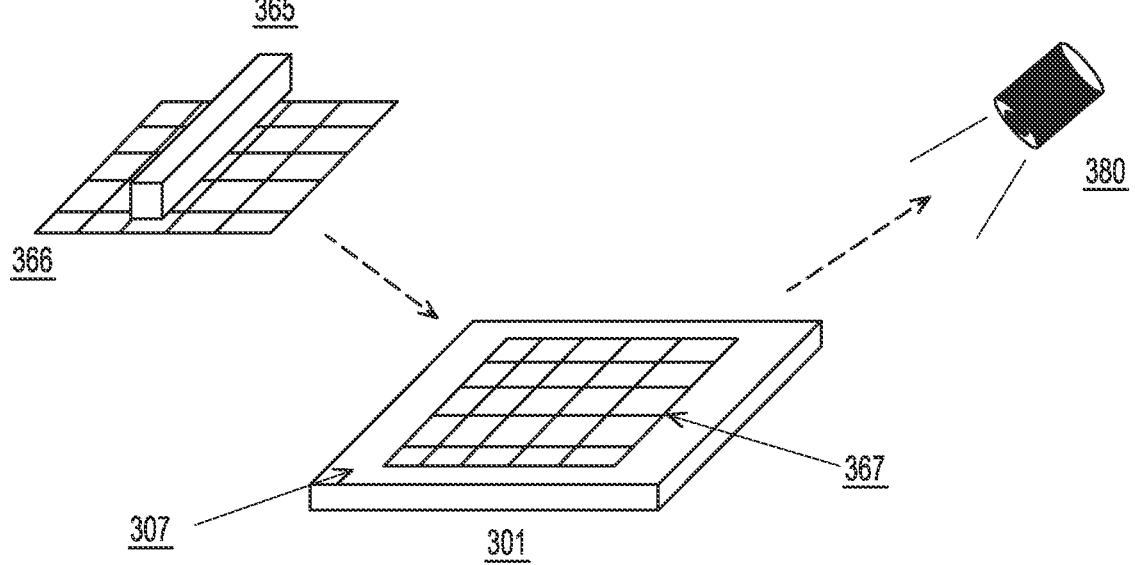
FIG. 3A is a diagram of a pattern projection in accordance with some embodiments.

FIG. 3A is a first diagram of a pattern projection system in accordance with various embodiments. In some embodiments, the pattern projection system is integrated with an automounter (not shown) that robotically mounts the mask-pellicle system to a mask stage over the wafer stage 320 within the exposure tool 300. In various instances, the automounter is programmed to initiate the inspection processes herein once the mask-pellicle system 360 is placed and ready for operations in the exposure tool 300, and the inspection is performed before lithography operations commence on a semiconductor wafer. The pattern projection system, in various instances, includes a light source 365, a patterned film 366 and an optical sensor 380. In one or more embodiments, the light source 365 generates light in one or more wavelengths between 200 nm and 1500 nm, and such light is directed through the patterned film 366 such that a shadow 367 of the pattern therein is cast upon the membrane 307 of the pellicle 300. To maximize defect detection, in various instances, the shadow 367 extends along the entire length and width of the pellicle 301. In some cases, the shadow 367 extends just beyond the boundaries of the membrane 307 to ensure that the entirety of the membrane is inspected. In other instances, the boundaries of the shadow 367 extend exactly to the inner edge of the boundaries of the membrane 307. In some embodiments, the optical sensor 380 detects an image of the shadow 367 and an analysis is performed automatically to measure features of the shadow 367 (such as line or arc segments with the pattern and distances or angles between the same) and compares such measurements to stored values of the pattern being used. Alternatively, or in addition thereto, in embodiments where the pattern includes regular shapes, such as regular polygons, the regularity of line or arc segments, distances, angles and the like are measured and compared with other line or arc segments, distances, angles and the like in the shadow 367 for consistency, without reference to any stored values for the original pattern. In some embodiments, a combination of these two approaches are used. In various cases, the entirety of the pattern formed by the shadow 367 is inspected. If any discrepancy is found in the pattern based on such comparisons, a defect in the pellicle 301 at the corresponding location is identified, and lithography processes are halted while the pellicle 301 is replaced in various embodiments.

In some embodiments, the light source 365 is at least one of an infrared light source, a visible light source, a UV-A light source, a UV-B, and a UV-C light source. In various instances, the light source 365 operates in one or more wavelengths between 200 nm and 1500 nm. In some cases, the light source 365 is a unidirectional light source. In other embodiments, the light source 365 is an omni-directional light source. In some instances, the light source 365 includes one or more bulbs and/or light-emitting diodes (LEDs) to generate the light.

In some embodiments, the patterned film 366 is a thin, transparent film such as a mylar or the like, that has a pattern that is at least partially opaque formed thereon for projection on to the pellicle 301. In some embodiments, the pattern is formed from an ink, a metal, or other opaque substance applied to or formed with the patterned film 366 in a wide variety of manners, such as laser printing, ink jet printing, pattern transfer methods, metal deposition or the like. In various instances, the pattern includes a plurality of adjoining regular polygons or concentric circles to assist in inspection of the shadow 367 generated by the pattern, as described further below. In certain cases, the light source 365 includes one or more patterned lenses or similar optical elements to generate the pattern directly without use of an intervening patterned film 366.

In various embodiments, the optical sensor 380 is a digital image sensor configured to detect light in one or more wavelengths between 200 nm and 1500 nm, which match the wavelengths generated by the light source 365. In some cases, the optical sensor 380 includes a charge coupled device (CCD). In some cases, the optical sensor 380 includes a processor and suitable programming for analyzing the shadow 367 to determine various length, distance and angle measurements of the pattern therein. In other instances, the data gathered by the optical sensor 380 is transmitted to computer system 500 for such processing. In yet further embodiments, processing is performed in part by the optical sensor 380 and the computer system 500 in cooperation.

Figure 3B:
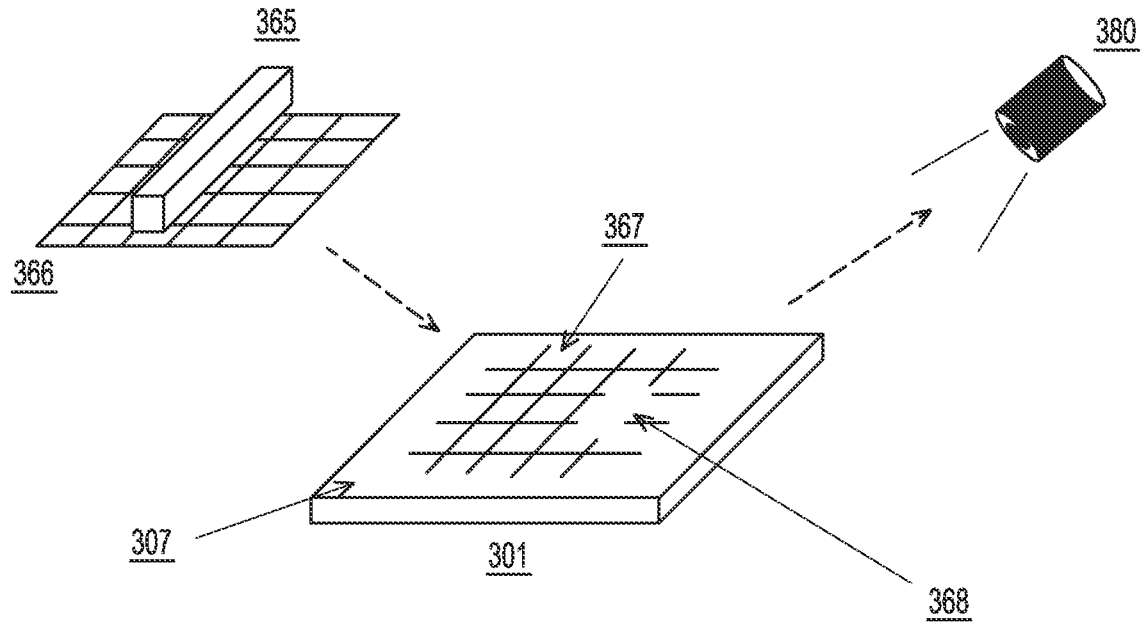
FIG. 3B is a second diagram of a pattern projection in accordance with some embodiments.

FIG. 3B is a second diagram of the pattern projection system in accordance with various embodiments. In some cases, an inspection will reveal an anomaly 368, such as distortion or discrepancy of one or more lengths, distances, or angles of the pattern within the shadow 367, which is caused by an underlying physical wrinkle, rip, tear, contamination other damage or defect in the membrane 307 of the pellicle 301 onto which the pattern is projected. In some instances, the anomaly 368 of suitable size will be visible to the human eye. In other instances, the anomaly 368 is smaller and only detectable by machine inspection, such as with the optical sensor 380. In various instances, more than one anomaly 368 is present in various sections of the membrane 307 and detected during an inspection.

Figure 3C:
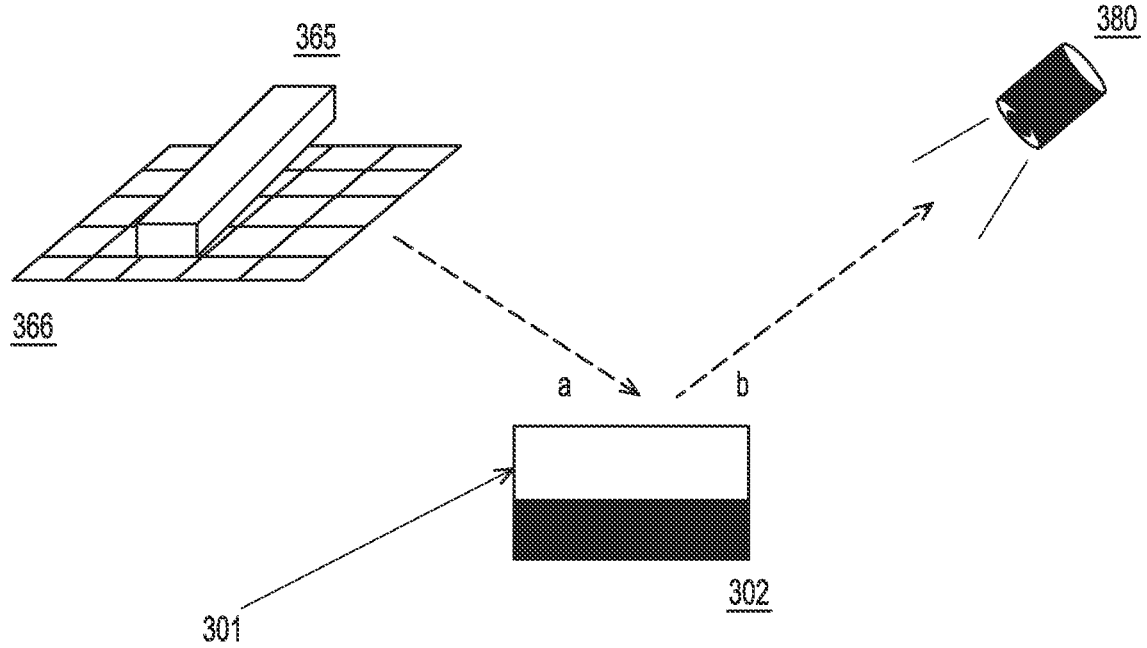
FIG. 3C is a third diagram of a pattern projection system in accordance with some embodiments.

FIG. 3C is a third diagram of the pattern projection system in accordance with various embodiments. In one or more instances, light is directed from the light source 365 through the transparent film 366 at an angle less than 90 degrees from vertical (i.e., non-vertically) so as to allow separation between the light source 365 and the optical sensor 380, thus preventing any interference therebetween from stray light. In such cases, the angle is between 5 degrees and 85 degrees. Accordingly, the angle of incidence (labeled 'a' in FIG. 3C) of the shadow 367 from the pattern of the patterned film 366 on to the facing surface of the membrane 307 is likewise between 5 and 85 degrees in those instances. The shadow 367 becomes progressively less exaggerated as the angle of incidence increases from 5 degrees. In one or more embodiments, the angle of incidence, as well as the distance of the patterned film 366 from the membrane 307, are provided as inputs to the optical sensor 380 and/or the computer system 500 to improve the accuracy of pattern recognition and measurement performed thereby during the inspection process. Such exaggerations of lengths or angles caused by the angle of incidence are geometrically corrected for, when necessary, in various embodiments.

Light at the appropriate wavelengths will then be reflected off the surface of the membrane 307 at an angle of reflection (labeled "b' in FIG. 3C) that is substantially equal to the angle of incidence (allowing for minor normal surface imperfections from horizontal), i.e., substantially between 5 and 85 degrees in various instances. In one or more embodiments, the optical sensor 380 is positioned and angled (i.e., at the same angle as the angle of reflection) to optimally receive the reflected pattern from the reflected light off the surface of the membrane 307 of the pellicle 301 for capture and subsequent analysis. In various instances the distance of the optical sensor 380 from the surface of the membrane 307 is determined and provided as an input to the optical sensor 380 and/or the computer system 500 to further improve the accuracy of pattern recognition and measurement performed thereby during the inspection process.

Various types of patterns are useful for being projected and measured according to the methods described herein. In various embodiments, the pattern includes one or more separate and/or adjoined shapes including, but not limited to: triangles, squares, rectangles, circles (individual or concentric), ellipses, ovals, pentagons, hexagons, heptagons, octagons, nonagons, decagons, other regular polygons, irregular polygons, honeycomb patterns and the like. Ease of analysis improves when regular shapes are used, since simpler, more computationally efficient mathematics would be used in automated pattern recognition and measuring calculations in comparison to irregular or complex shapes. Deformities or discrepancies in a pattern of regular shapes are also generally more readily recognized in human inspection than in a complex pattern, particularly as such defects decrease in size. However, the embodiments herein are not so limited.

Figure 4A:
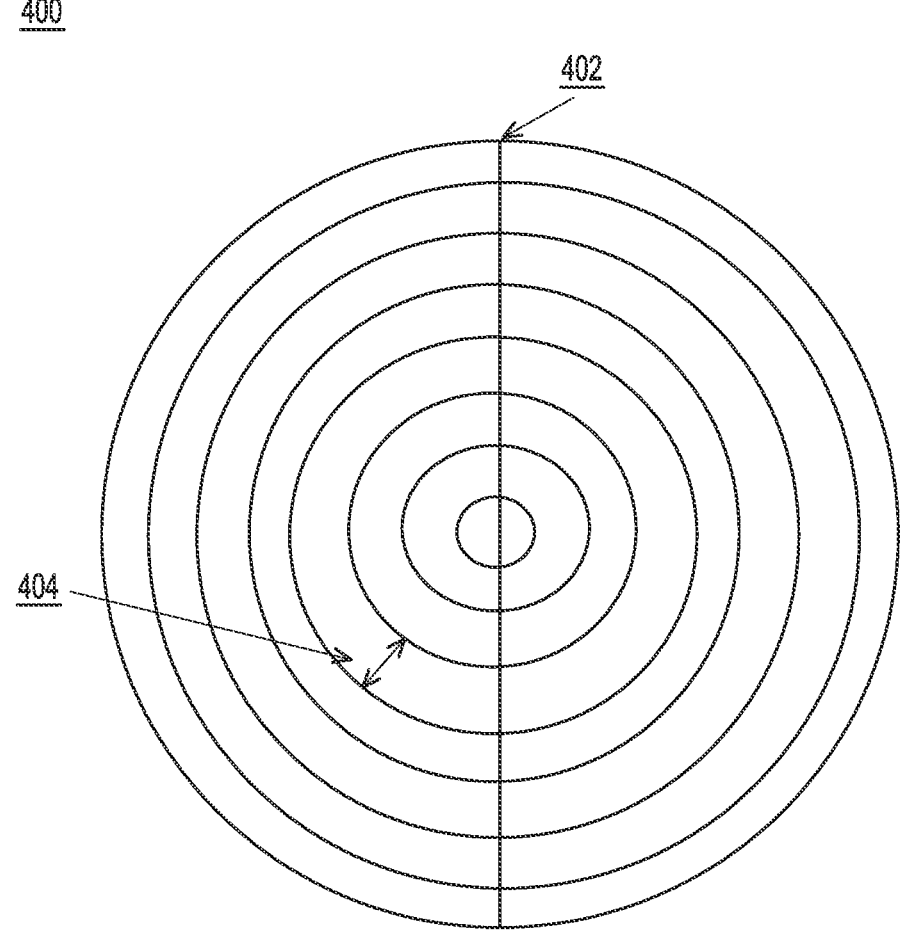
FIG. 4A is an exemplary pattern in accordance with some embodiments.

FIG. 4A shows a first exemplary pattern 400 that is useful for the pattern projection system in accordance with various embodiments. In some embodiments, the pattern 400 includes a plurality of concentric circles having a maximum diameter 402 and a radial separation 404. In some embodiments, considering that the membrane 307 used in lithography is typically rectangular, the concentric circles extend beyond the maximum length and width of the membrane 307 when it is projected thereon in order to provide coverage across the entire membrane 307 with no sections left uncovered for inspection purposes. In some embodiments, the smallest concentric circle has a diameter that is at or above the bottom end of the resolution range of the optical sensor 380 used to measure it (e.g., in the range of 5-10 nm). Similarly, the radial separation 404 of the concentric circles is greater than the minimum resolution range of the optical sensor 380, namely at least 5-10 nm. In some embodiments, the maximum diameter 402 is between 205 mm and 500 mm, so as to cover the entirety of the membrane 307. In some embodiments, a spiral is used in similar manner in place of concentric circles. In some embodiments, one or more nested ovals or ellipses are used in similar manners in place of concentric circles.

During the inspection process, the various circles in the pattern 400 are recognized, such as by pattern recognition algorithms in various embodiments. Any distortions in one or more circles, such as missing sections of an arc thereof or a variation in the radial separation 404 with neighboring circles, is recognized as a defect in the membrane 307, in various instances. In various embodiments where the pattern 400 extends beyond the boundaries of the membrane 307, locations of endpoints of any overextending circles are noted, and any defects that extend beyond the boundaries of the membrane 307 are programmatically ignored. For such purposes, the locations of the boundaries of the membrane 307 are provided as an input to or programmatically recognized by the optical sensor 380 and/or the computer system 500 for improving the inspection process in various embodiments.

Figure 4B:
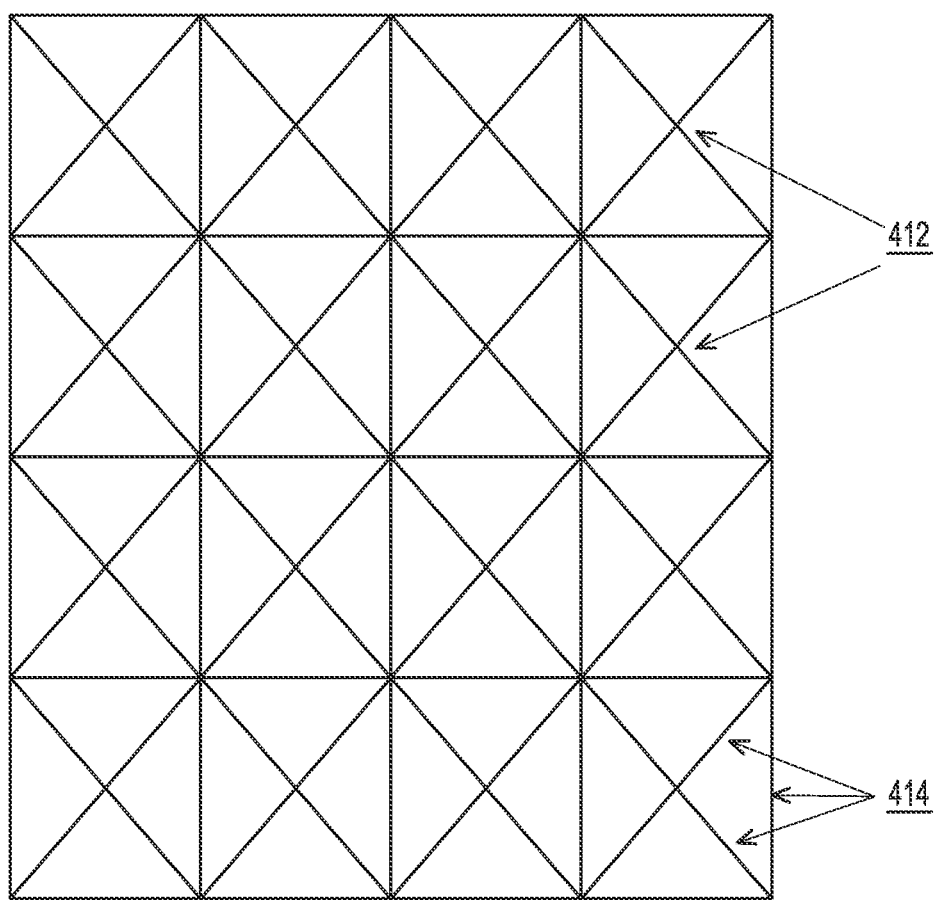
FIG. 4B is a second exemplary pattern in accordance with some embodiments.

FIG. 4B shows a second exemplary pattern 410 that is useful for the pattern projection system in accordance with various embodiments. In some embodiments, the pattern 410 includes a plurality of triangles, formed by line segments 414 and having three internal angles 412. In some instances, one or more of the triangles are separated from the others within the pattern. In some instances, one or more of the triangles are adjoined as shown in FIG. 4B. In some instances, the adjoining triangles form a complete rectangle at their periphery at the boundaries of the membrane 307. In various cases, the triangles are isosceles triangles. In some instances, the triangles are right triangles. In some embodiments, each internal angle between any two legs of the triangles are between 5 and 170 degrees. In some embodiments, the line segments 414 have a minimum length corresponding to the lowest resolution of the optical sensor 380 and a maximum length corresponding to the longest boundary length of the membrane 307. In some cases, the two of the internal angles 412 of the right triangles are both 45 degrees. In other instances, two remaining internal angles 412 of the right triangle have differing values that add up to 90 degrees.

During the inspection process, the various triangles in the pattern are recognized, such as by pattern recognition algorithms in various embodiments. Any distortions in one or more triangles, such as missing sections of a line segment 414 thereof or a variation in an internal angle 414, is recognized as a defect in the membrane 307, in various instances.

Figure 4C:
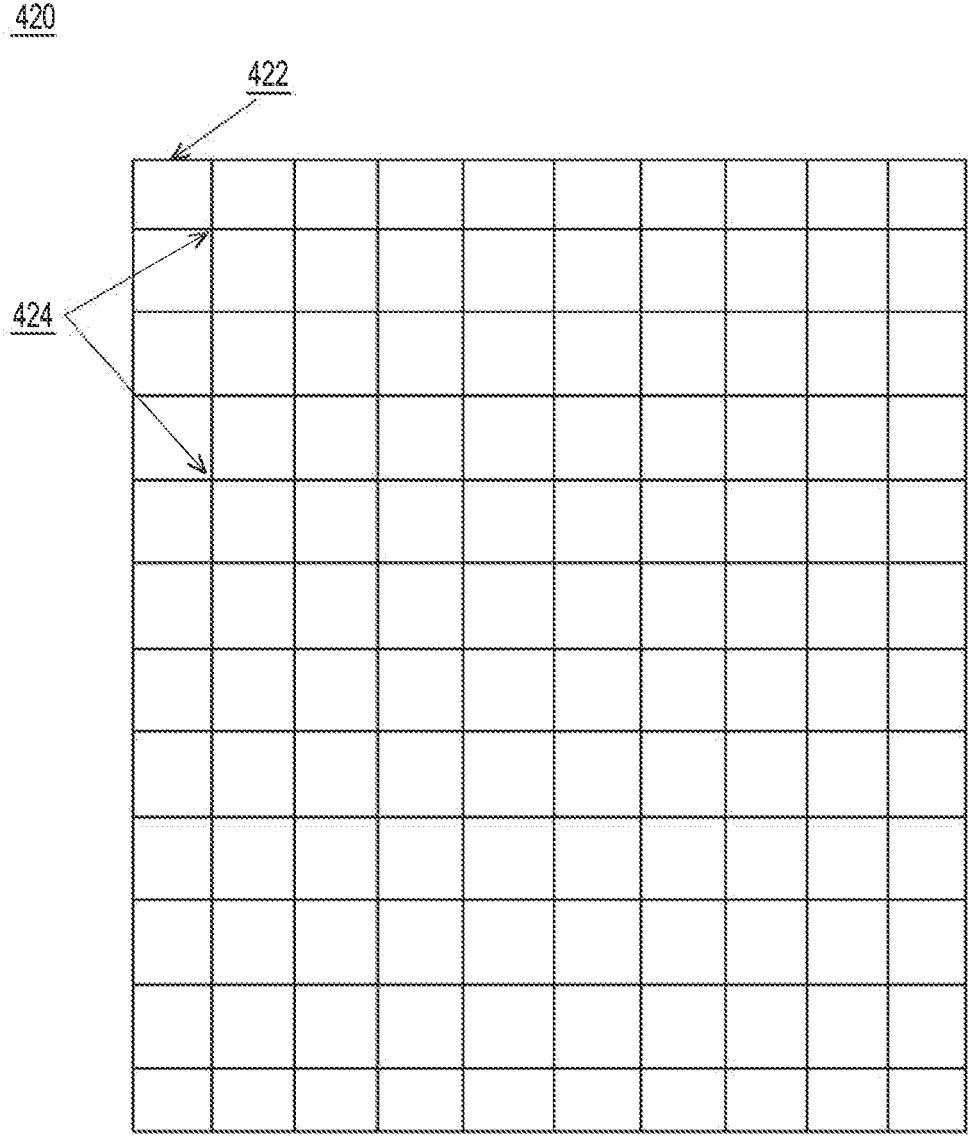
FIG. 4C is a third exemplary pattern in accordance with some embodiments.

FIG. 4C shows a third exemplary pattern 420 that is useful for the pattern projection system in accordance with various embodiments. In some embodiments, the pattern includes a plurality of rectangles, formed by line segments 422 and having four equal internal angles 424 of 90 degrees. In some instances, one or more of the rectangles are separated within the pattern. In some instances, one or more of the rectangles are adjoined as shown in FIG. 4C. In some instances, the adjoining rectangles form a complete rectangle at their periphery at the boundaries of the membrane 307. In various cases, the rectangles are squares. In some embodiments, the line segments 414 have a minimum length corresponding to the minimum resolution of the optical sensor 380 and a maximum length corresponding to the longest boundary length of the membrane 307.

During the inspection process, the various rectangles in the pattern 420 are recognized, such as by pattern recognition algorithms in various embodiments. Any distortions in one or more rectangles, such as missing sections of a line segment 422 thereof or a variation in an internal angle 424, is recognized as a defect in the membrane 307, in various instances.

Figure 4D:
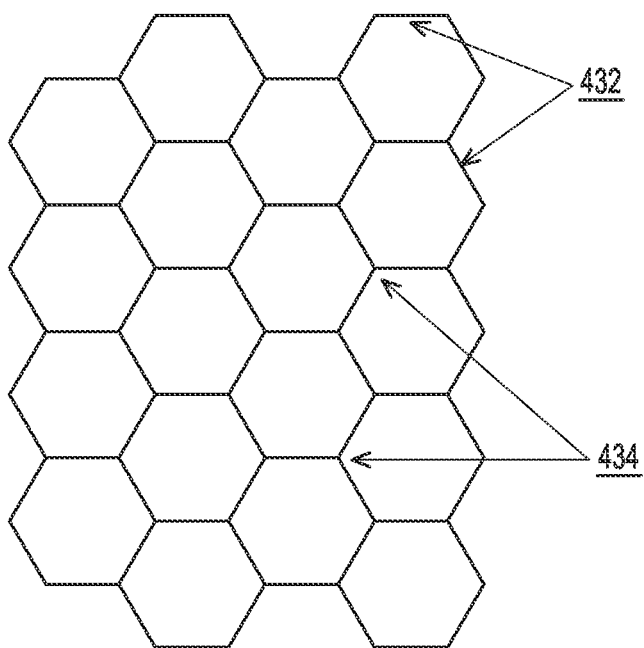
FIG. 4D is a fourth exemplary pattern in accordance with some embodiments.

FIG. 4D shows a fourth exemplary pattern 430 that is useful for the pattern projection system in accordance with various embodiments. In some embodiments, the pattern 430 includes a plurality of polygons, formed by greater than four line segments 414 and having five or more internal angles 412. In some instances, one or more of the polygons are separated within the pattern. In some instances, one or more of the polygons are adjoined as shown in FIG. 4B, sometimes referred to as a honeycomb pattern. In various cases, the polygons are regular polygons having an even number of connecting line segments 432 and constant internal angles 434. In some instances, the polygons have an odd number of line segments 432 and constant internal angles

434. In some embodiments, the polygons are pentagons (having constant internal angles 434 of 108 degrees), hexagons (as shown in FIG. 4C, and having constant internal angles 434 of 120 degrees), heptagons (having constant internal angles 434 of 128.57 degrees), octagons (having constant internal angles 434 of 135 degrees), nonagons (having a constant internal angle 434 of 140 degrees) and decagons (having constant internal angles of 144 degrees). Polygons greater than decagons having increasing internal angles 434 approaching 180 degrees that are less and less consistently distinguishable based on the resolution of the optical sensor 380 and the size of the polygons within the pattern, and so are not useful in various embodiments. In some embodiments, the line segments 414 are all equal and have a minimum length corresponding to the minimum resolution of the optical sensor 380 and a maximum length corresponding to the longest boundary length of the membrane 307. In other instances, the polygons are irregular polygons.

During the inspection process, the various polygons in the pattern 430 are recognized, such as by pattern recognition algorithms in various embodiments. Any distortions in one or more polygons, such as missing sections of a line segment 432 thereof or a variation in an internal angle 434, is recognized as a defect in the membrane 307, in various instances.

Figure 5A:
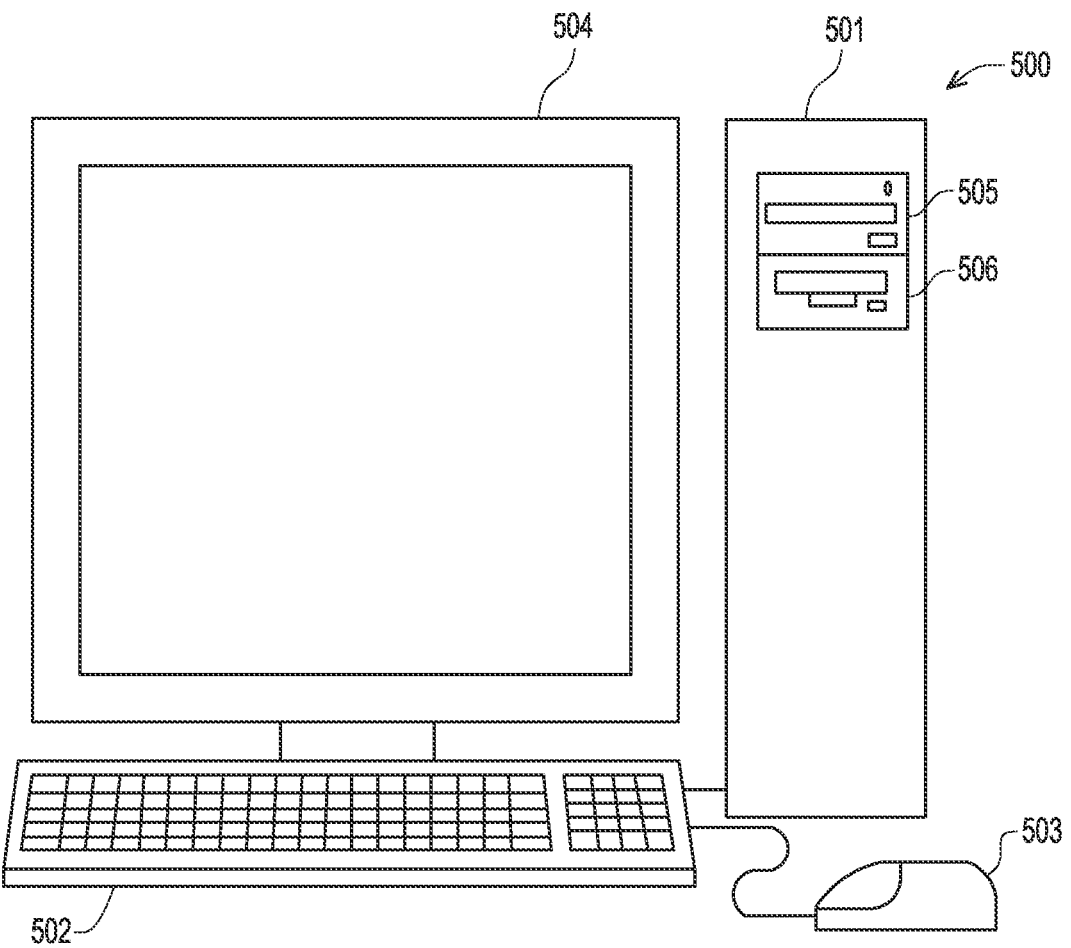
FIG. 5A and FIG. 5B are diagrams of a controller in accordance with some embodiments.
Figure 5B:
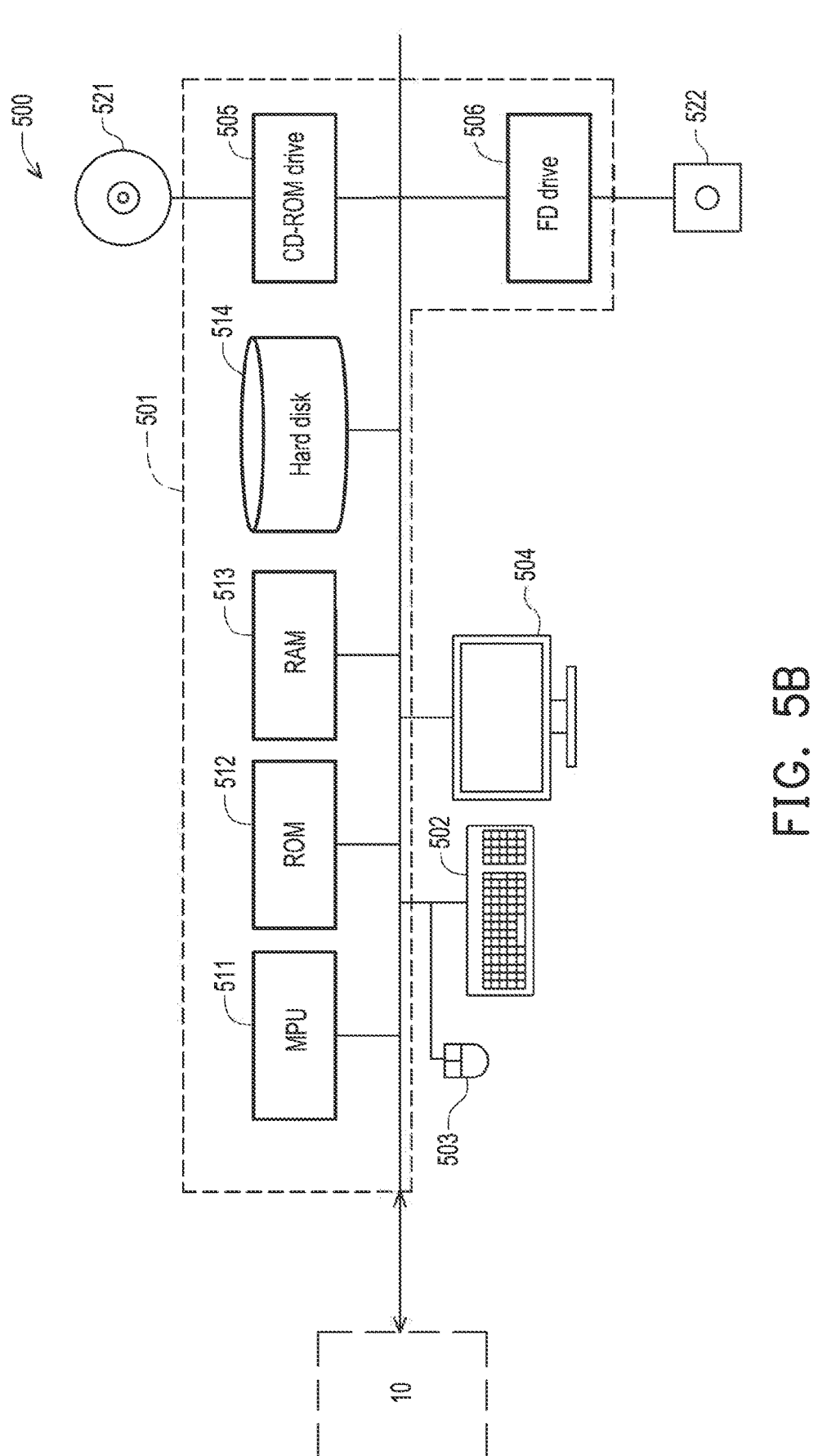

FIG. 5A and FIG. 5B illustrate a computer system 500 for controlling the system 10 and its components in accordance with various embodiments of the present disclosure. FIG. 5A is a schematic view of one example of a computer system 500. In some embodiments, the computer system 500 is programmed to initiate a process for inspecting a pellicle 301 of the system 10, and provide an alert when errors are detected on its surface. In some embodiments, manufacturing of semiconductor devices is halted in response to such an alarm. As shown in FIG. 5A, the computer system 500 is provided with a computer 501 including an optical disk read only memory (e.g., CD-ROM or DVD-ROM) drive 505 and a magnetic disk drive 506, a keyboard 502, a mouse 503 (or other similar input device), and a monitor 504.

FIG. 5B is a diagram showing an example of an internal configuration of the computer system 500. In FIG. 5B, the computer 501 is provided with, in addition to the optical disk drive 505 and the magnetic disk drive 506, one or more processors 511, such as a micro-processor unit (MPU) or a central processing unit (CPU); a read-only memory (ROM) 512 in which a program such as a boot up program is stored; a random access memory (RAM) 513 that is connected to the processors 511 and in which a command of an application program is temporarily stored, and a temporary electronic storage area is provided; a hard disk 514 in which an application program, an operating system program, and data are stored; and a data communication bus 515 that connects the processors 511, the ROM 512, and the like. Note that the computer 501 includes a network card (not shown) in some embodiments for providing a connection to a computer network, such as a local area network (LAN), wide area network (WAN) or any other useful computer network for communicating data used by the computer system 500 and the system 10. In various embodiments, the computer system 500 communicates via wireless or hardwired connection to the system 10 and its components as described herein.

In various instances, the program for causing the computer system 500 to execute the process for controlling the system 10 and components thereof, and/or to execute the processes for manufacturing a semiconductor device according to the embodiments disclosed herein, are stored in an optical disk 521 or a magnetic disk 522, which is inserted into the optical disk drive 505 or the magnetic disk drive 506, and transmitted to the hard disk 514. In alternative embodiments, the program is transmitted via a network (not shown) to the computer system 500 and stored in the hard disk 514. At the time of execution, the program is loaded into the RAM 513. The program is loaded from the optical disk 521 or the magnetic disk 522, or directly from a network in various embodiments.

The stored programs do not necessarily have to include, for example, an operating system (OS) or a third-party program to cause the computer 501 to execute the methods disclosed herein. The program may only include a command portion to call an appropriate function (module) in a controlled mode and obtain desired results in some embodiments. In various embodiments described herein, the computer system 500 is in communication with the lithography system 10 to control various functions thereof.

The computer system 500 is coupled to the system 10 in various embodiments. The computer system 500 is configured to provide control data to those system components and receive process and/or status data from those system components. For example, the computer system 500 comprises a microprocessor, a memory (e.g., volatile or non-volatile memory), and a digital I/O port capable of generating control voltages sufficient to communicate and activate inputs to the processing system, as well as monitor outputs from the lithography apparatus 10. In addition, a program stored in the memory is utilized to control the aforementioned components of the lithography system 10 according to a process recipe. Furthermore, the computer system 500 is configured to analyze the process and/or pattern data, to compare the process and/or pattern data with target process and/or pattern data, and to use the comparison to change a process and/or control a system component. In addition, the computer system 500 is configured to analyze the process and/or pattern data, to compare the process and/or pattern data with historical process and/or stored data, and to use the comparison to predict, prevent, and/or declare a fault or alarm due to a membrane defect when an anomaly 368 is discovered.

Figure 6:
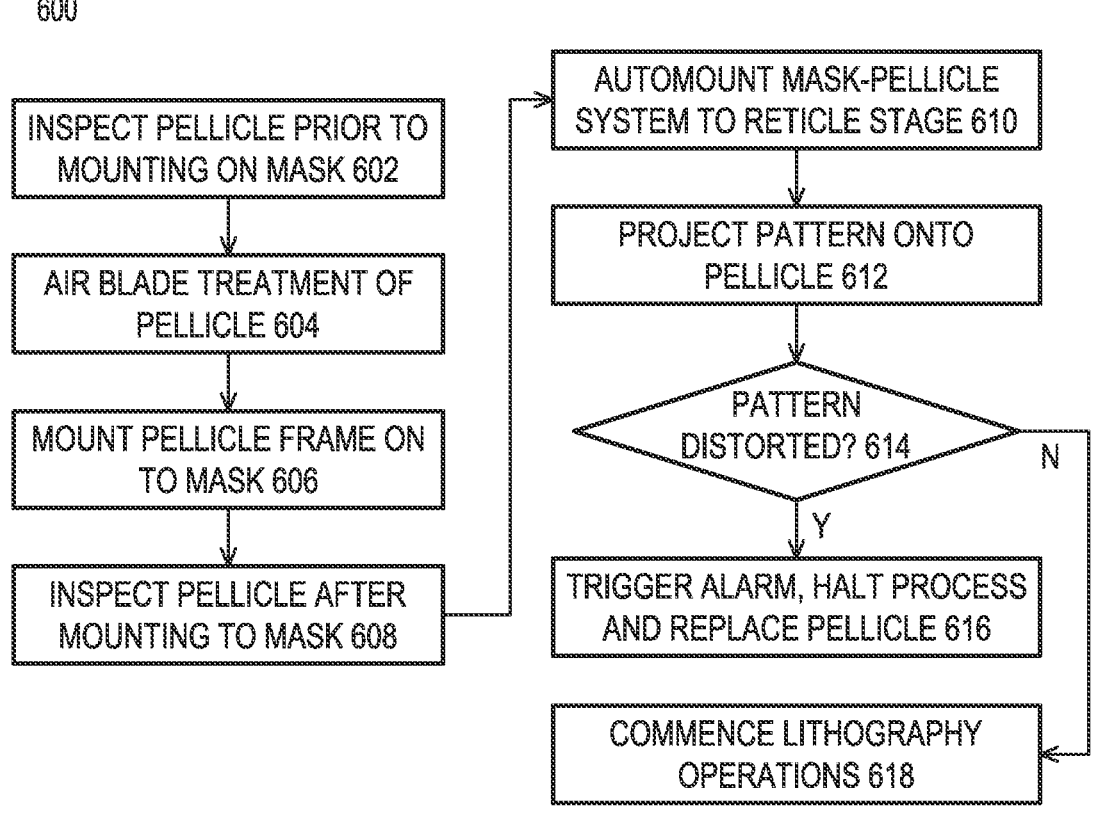
FIG. 6 is a flowchart of a process for inspecting a pellicle using pattern projection in accordance with some embodiments.

FIG. 6 is a flowchart of an inspection process 600 in accordance with various embodiments. In some embodiments, the inspection process 600 is controlled by the computer system 500 and/or the optical sensor 380. The inspection process 600 commences at operation 602 when a membrane 307 on a frame 304 of a pellicle 301 is visually inspected prior to mounting on a mask 602 in various embodiments. In some instances, the automated inspection operations described later below are used in place of manual visual inspection. If a defect is found, the membrane 307 is replaced and the process 600 recommences. When no apparent defects are found, the process 600 next involves providing an air blade or similar cleaning treatment to the membrane 307 (operation 604) in one or more embodiments.

Thereafter, in various embodiments, the pellicle 301 is mounted to the mask 302 in any of the manners described in the foregoing (operation 606). After mounting, in some embodiments, the membrane 307 of the pellicle 301 is again inspected and replaced if a defect or distortion is found (operation 608). In some instances, the automated inspection operations described later below are used in place of manual visual inspection. When the membrane 307 remains free of defects, in various embodiments, it is next loaded into the exposure tool 300 (operation 610) above the wafer 326 such that it and the mask 302 are protected during lithography operations. In some embodiments, an automounter is used to robotically load and unload the mask-pellicle structure 360 from within the exposure tool 300. In some embodiments, the automounter includes the pattern projection system including the light source 365, the patterned film 366 and the optical sensor 380, as described previously above.

After mounting the mask-pellicle system 360 in place, the pattern projection system projects a pattern onto the surface of the membrane 307 of the pellicle 301 at a known angle of incidence and distance from the surface (operation 612). In some instances, the projection of the pattern is arranged so that the pattern size is precisely projected at the same size onto the surface of the membrane 307. In alternate embodiments, the projected pattern is bigger or smaller than the size of the actual pattern.

Next, the optical sensor 380 receives the reflected pattern and, through programming, it alone and/or in conjunction with the computer system 500 determines whether there is a distortion in the reflected pattern (operation 614). In various embodiments, and as later described further, the distortion, anomaly 368 or the like is identified when one or more arcs, line segment or internal angles as measured from the reflected pattern do not match expected values. In some instances, a line segment, arc segment, radial distance or internal angle measured at a given location in the reflected pattern are compared to stored or measured values for the pattern on the patterned film, and with any necessary geometric corrections based on angle of incidence and distance of the pattern from the surface of the membrane 307, are compared for consistency. In other instances, the measured values are instead compared to other instances of such line segment, arc segment or angle within the reflected pattern itself, particularly when the pattern includes regular shapes with repeating, uniform, line segments, arc segment and internal angles. Such measurements and comparisons occur dozen, hundreds or even thousands of times to cover each shape in the projected pattern during a single inspection process for a single wafer 326. Thus, the speed at which an inspection can be performed will impact overall manufacturing throughput. When any measured value is not consistent with an expected stored or measured value, in such instances, an anomaly 368 is identified.

Next, at operation 616, when an anomaly 368 has been identified, an alarm is triggered by the computer system 500 and the lithography process is halted while the pellicle 301 is replaced and re-inspected as in the foregoing. After replacement and successful inspections, the automounter and pattern projection system is removed from the exposure tool 300 and lithography processes commence (operation 618).

In various embodiments described hereinabove, the automated measuring and analysis of the reflected pattern by one or more of the optical sensor 380 and the computer system 500 has been referenced. Such analysis and measuring, in some instances, is performed by a suitable resident programmed artificial intelligence (AI) module that is programmed with expected values for measured line segments, arcs, other distances and internal angles of present shapes in a reflected pattern. In additional cases, a machine learning algorithm, that has been programmed with the results of previous detections of anomalies 368 in prior inspections for learning therefrom is used alternatively or in addition to an AI module as described. In some cases, a reflected pattern to original pattern comparison of measured values is performed by inspecting the reflection of the pattern with an artificial intelligence module that measures a plurality of angles within the reflection of the pattern and identifies the distortion when at least one measured angle in the reflection of the pattern does not match a stored angle value. In some cases, an AI module is used to inspect the reflection of the pattern to measure a plurality of distances within the reflection of the pattern and identify a distortion or discrepancy when at least one measured distance in the reflection of the pattern does not match a stored expected distance value. In some cases, the AI module measures at least one of a length of a line segment, a distance, and an internal angle of a shape in the pattern and identifies a distortion when at least one of the same do not match a stored expected value. In various cases, the stored expected value is based on the values of the line segments, distances, and internal angles present in the patterned film 366. In some instances, the AI module measures at least one of: lengths of a plurality of parallel line segments within the pattern and a plurality of angles between parallel line segments within the pattern and identifies a distortion when (i) at least one of the plurality of parallel line segments does not match the lengths of the remaining parallel line segments within the reflection and (ii) at least one of the plurality of angles does not match another angle within the reflection. In some embodiments, the machine-learning algorithm is programmed from human identification of shadows and blurs in a pattern without reference to specific angles, distances, or lengths.

FIG. 7A is exemplary computer code for comparing lengths and angles between two patterns according to various embodiments. FIG. 7B is exemplary computer code for comparing lengths and angles within a pattern according to various embodiments.

This disclosure introduces methods and apparatus for inspecting a pellicle to prevent wrinkles, tears and ruptures. Increasing the accuracy and speed of such inspections with automated apparatus increases the manufacturing yield of the lithography system 10 due to fewer overlay errors, resulting in improved exposure quality on the scanner side. EUV pellicle inspection by CCD module AI recognition, in various embodiments, reduces instances of using ruptured or compromised pellicles 301 in the tool 300 before and after treatment. The disclosed inspection processes avoid risk of equipment and wafer damage and save manpower, thereby decreasing manufacturing process times.

According to various embodiments, a method for enhancing a semiconductor device manufacturing process includes placing a pellicle on a surface of a mask, projecting a pattern on a surface of the pellicle, measuring a reflection of the pattern from the pellicle and when the reflection of the pattern includes a distortion, triggering an alarm that halts the semiconductor device manufacturing process. In some embodiments, placing the pellicle on the mask further includes adhering the pellicle on a frame and placing the frame on the surface of the mask. In some instances, projecting the pattern further includes activating a light source and directing the light through a transparent film having the pattern. In some embodiments, directing the light further includes directing the light through a surface of the transparent film at an angle of incidence between 5 degrees and 85 degrees. In some cases, an angle of reflection of the pattern from the surface of the pellicle is between 5 degrees and 85 degrees. In some embodiments, the light has a wavelength between 200 nm and 1500 nm. In some instances, the pattern includes a plurality of concentric circles having a minimum separation between circles of 5 nm. In some instances, the pattern includes a plurality of triangles, where each of the triangles has a leg having a minimum length of 5 nm and an internal angle between two legs of between 5 and 170 degrees. In some instances, the pattern includes a plurality of rectangles, where each of the rectangles has a leg having a minimum length of 5 nm and an internal angle between two legs of 90 degrees. In some instances, the pattern includes a plurality of regular polygons, where each of the regular polygons has a side having a minimum length of 5 nm and an internal angle between each side is between 108 degrees and 144 degrees. In some embodiments, the reflection of the pattern is inspected with an artificial intelligence module that measures a plurality of angles within the reflection of the pattern and identifies the distortion when at least one measured angle in the reflection of the pattern does not match a stored angle value. In some embodiments, the reflection of the pattern is inspected with an artificial intelligence module that measures a plurality of distances within the reflection of the pattern, and identifies the distortion when at least one measured distance in the reflection of the pattern does not match a stored distance value.

According to various embodiments, a method for inspecting a pellicle includes directing a light source through the pellicle, receiving a reflection of a pattern from a surface of a pellicle membrane, measuring at least one of (i) a length of a segment of the pattern and (ii) an angle between two segments of the pattern. In various embodiments, when at least one of the length and the angle matches a predetermined value for the length or the angle, a manufacturing process on an underlying semiconductor substrate is commenced. In various embodiments, when at least one of the length and the angle is distorted, an alarm is triggered, which halts the semiconductor device manufacturing process. In some embodiments, the pattern includes at least one of a circle, a triangle, a rectangle and a regular polygon. In some embodiments, the reflection is measured with an artificial intelligence module that measures at least one of the length and the angle and identifies a distortion when at least one of the length and the angle does not match a stored value for the pattern. In some embodiments, the reflection is measured with an artificial intelligence module that measures at least one of: lengths of a plurality of parallel line segments within the pattern and a plurality of angles between parallel line segments within the pattern. In such embodiments, a distortion is identified when (i) at least one of the plurality of parallel line segments does not match the lengths of the remaining parallel line segments within the reflection and (ii) at least one of the plurality of angles does not match another angle within the reflection. In some instances, the reflection of the pattern arrives at an angle of reflection off the surface of the pellicle that is between 5 degrees and 85 degrees. In some cases, the reflection is received using a CCD.

According to various embodiments, an extreme ultraviolet (EUV) lithography system having an exposure tool includes a mounter for automatically mounting a pellicle frame on a mask within the exposure tool, a transparent film having a pattern that is at least partially opaque, a light source configured to illuminate the transparent film such that the pattern is projected on a surface of the pellicle to generate a reflected pattern, a digital image sensor configured to detect the reflected pattern, and a computer system configured to measure at least one of an angle and a line segment of the reflected pattern, and generate an alarm to halt operation of the EUV lithography system when at least one of the angle and the line segment is distorted. In some embodiments, the digital image sensor includes a CCD.

The foregoing outlines features of several embodiments or examples so that those skilled in the art better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for enhancing a semiconductor device manufacturing process, comprising:
   placing a pellicle on a surface of a mask;
   projecting a pattern on a surface of the pellicle, wherein projecting the pattern comprises:
   activating a light source; and
   directing light through a surface of a transparent film having the pattern at an angle of incidence of between 5 degrees and 85 degrees;
   measuring a reflection of the pattern from the pellicle; and
   performing the semiconductor device manufacturing process when a discrepancy between the measured reflection and stored values of the pattern is within a predetermined tolerance limit.

2. The method of claim 1, wherein placing the pellicle on the mask further comprises:
   adhering the pellicle on a frame; and
   placing the frame on the surface of the mask.

3. The method of claim 1, wherein an angle of reflection of the pattern from the surface of the pellicle is between 5 degrees and 85 degrees.

4. The method of claim 1, wherein the light has a wavelength between 200 nanometers (nm) and 1500 nm.

5. The method of claim 1, wherein the pattern includes a plurality of concentric circles having a minimum separation between circles of 5 nm.

6. The method of claim 1, wherein the pattern includes a plurality of triangles, wherein each of the triangles has a leg having a minimum length of 5 nanometers and an internal angle between two legs of between 5 and 170 degrees.

7. The method of claim 1, wherein the pattern includes a plurality of rectangles, wherein each of the rectangles has a leg having a minimum length of 5 nanometers and an internal angle between two legs of 90 degrees.

8. The method of claim 1, wherein the pattern includes a plurality of regular polygons, wherein each of the regular polygons has a side having a minimum length of 5 nanometers and an internal angle between each side is between 108 degrees and 144 degrees.

9. The method of claim 1, further comprising:
   inspecting the reflection of the pattern with an artificial intelligence module that measures a plurality of angles within the reflection of the pattern and identifies a distortion when at least one measured angle in the reflection of the pattern does not match a stored angle value.

10. The method of claim 1, further comprising:
    inspecting the reflection of the pattern with an artificial intelligence module that measures a plurality of distances within the reflection of the pattern and identifies a distortion when at least one measured distance in the reflection of the pattern does not match a stored distance value.

11. The method of claim 1, further comprising:
    when the discrepancy between the measured reflection and the stored values of the pattern is outside the predetermined tolerance limit, triggering an alarm that halts the semiconductor device manufacturing process.

12. A method for enhancing a semiconductor device manufacturing process, comprising:
    placing a pellicle on a surface of a mask,
    wherein the pellicle includes a membrane disposed over a frame;
    casting a shadow of a pattern on a surface of the membrane, wherein casting a shadow of the pattern comprises activating a light source and directing light through a surface of a transparent film having the pattern at an angle of incidence between 5 degrees and 85 degrees, and an angle of reflection of the pattern from the surface of the membrane is between 5 degrees and 85 degrees;
    detecting an image of the shadow of the pattern using an optical sensor;
    measuring features of the shadow of the pattern;
    comparing the measured features with stored values of the pattern; and
    performing the semiconductor device manufacturing process when a discrepancy between the measured features and the stored values of the pattern is within a predetermined tolerance limit.

13. The method of claim 12, further comprising:
    adhering the pellicle on a frame; and
    placing the frame on the surface of the mask.

14. The method of claim 12, wherein the pattern includes a plurality of concentric circles having a minimum separation of 5 nm between adjacent circles of the plurality of concentric circles.

15. The method of claim 12, further comprising:
    inspecting the shadow of the pattern with an artificial intelligence module that measures a plurality of angles within the shadow of the pattern and identifies the discrepancy when at least one measured angle in the shadow of the pattern does not match a stored angle value; and
    inspecting the shadow of the pattern with the artificial intelligence module that measures a plurality of distances within the shadow of the pattern and identifies the discrepancy when at least one measured distance in the shadow of the pattern does not match a stored distance value.

16. A method for enhancing a semiconductor device manufacturing process, comprising:
    placing a pellicle on a surface of a mask;
    projecting a pattern on a surface of the pellicle, wherein the pattern includes a plurality of concentric circles, and projecting the pattern comprises:
    activating a light source; and
    directing light through a surface of a transparent film having the pattern at an angle of incidence between 5 degrees and 85 degrees, and an angle of reflection of the pattern from the surface of the pellicle is between 5 degrees and 85 degrees;
    measuring a reflection of the pattern from the pellicle; and
    performing the semiconductor device manufacturing process when a discrepancy between the measured reflection and stored values of the pattern is within a predetermined tolerance limit.

17. The method of claim 16, wherein the plurality of concentric circles have a minimum separation of 5 nm between adjacent circles of the plurality of concentric circles.

18. The method of claim 12, further comprising:

when the discrepancy between the measured features and the stored values of the pattern is outside the predetermined tolerance limit, halting the semiconductor device manufacturing process.

19. The method of claim 16, further comprising:

when the discrepancy between the measured reflection and the stored values of the pattern is outside the predetermined tolerance limit, triggering an alarm that halts the semiconductor device manufacturing process.

20. The method of claim 16, wherein:

the pattern includes a plurality of triangles, wherein each of the triangles has a leg having a minimum length of 5 nanometers and an internal angle between two legs of between 5 and 170 degrees.

* * * * *